(12) United States Patent
Wallace et al.

(10) Patent No.: US 7,572,557 B2
(45) Date of Patent: Aug. 11, 2009

(54) NON-COLLINEAR END-TO-END STRUCTURES WITH SUB-RESOLUTION ASSIST FEATURES

(75) Inventors: Charles H. Wallace, Portland, OR (US);
Shannon E. Daviess, Hillsboro, OR (US); Swaminathan Sivakumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 594 days.

(21) Appl. No.: 11/297,209

(22) Filed: Dec. 7, 2005

(65) Prior Publication Data

US 2007/0128526 A1    Jun. 7, 2007

(51) Int. Cl.
*G03F 1/00* (2006.01)
*H01L 21/00* (2006.01)
*G06F 17/50* (2006.01)

(52) U.S. Cl. .............................. 430/5; 430/311; 716/20; 716/21

(58) Field of Classification Search .................... 430/5, 430/311; 716/19, 20, 21
See application file for complete search history.

(56) References Cited

U.S. PATENT DOCUMENTS

| | | | |
|---|---|---|---|
| 2003/0208742 A1* | 11/2003 | LaCour ...................... | 716/21 |
| 2004/0091790 A1* | 5/2004 | Chen et al. .................... | 430/5 |
| 2005/0202321 A1* | 9/2005 | Gordon et al. ................ | 430/5 |
| 2006/0019202 A1* | 1/2006 | Houston et al. ............. | 430/313 |

* cited by examiner

*Primary Examiner*—Mark F Huff
*Assistant Examiner*—Jonathan Jelsma
(74) *Attorney, Agent, or Firm*—Blakely, Sokoloff, Taylor & Zafman LLP

(57) ABSTRACT

Sub-resolution assist features for non-collinear features are described for use in photolithography. A photolithography mask with elongated features is synthesized. An end-to-end gap between two features if found for which the ends of the two features facing the gap are linearly offset from one another. A sub-resolution assist feature is applied to the end-to-end gap between the elongated features, and the synthesized photolithography mask is modified to include the sub-resolution assist feature.

15 Claims, 6 Drawing Sheets

Drawn

Corrected

Resist Edge

NON-COLLINEAR END-TO-END STRUCTURES WITH SUB-RESOLUTION ASSIST FEATURES

FIELD

The present description relates to semiconductor photolithography and, in particular, to applying sub-resolution assist features to non-collinear features.

BACKGROUND

In the production of semiconductors, such as memory, processors, and controllers, among others, a mask is used. The mask is placed over a semiconductor wafer to expose or shield different portions of the wafer from light, or some other element. The exposed wafer is then processed with etching, deposition and other processes to produce the features of the various semiconductors in the wafer that make up the finished product.

The masks are designed using computer design programs that derive an aerial view or image of the wafer based on the electronic circuitry that is to be built on the wafer. The mask is designed to produce this aerial image on the wafer based on using a particular set of photolithography equipment. In other words, the mask must be designed so that when a particular wavelength of light at a particular distance is directed to a wafer through a particular set of optics and the mask, the desired pattern will be illuminated with the desired intensity on the wafer.

The pattern on the mask may be very complex and finely detailed. In some systems, a mask is designed with a matrix of pixels in columns and rows that illuminate a wafer that has an area of about one square centimeter. The mask may be four or more times that size and reduction optics are used to reduce the mask image down to the size of the wafer. For a 193 nm light source, each pixel may be about 100 nm across so that the mask may have billions of pixels. Each pixel is either a transparent spot on the mask (1), an opaque spot on the mask (0), or a transparent spot that reverses the phase of the light passing through (−1). The use of three different values (+1, 0, −1) allows for greater control over the diffractive effects through the mask.

In order to enhance the accuracy and the resolution of the pattern that results on the wafer. A variety of different optimization techniques are typically applied to the mask. One such technique is to add sub-resolution assist features (SRAF) or scattering bars to a mask. These are usually small features in the form of parallel lines or spaces that are smaller than the resolution limit of the imaging system. In other words, the features are too small to be printed on the wafer through the lens but they influence the lithographic behavior of the larger features that they are near. For example, SRAFs in the form of parallel lines running along either side of a solid line improves the focus of the solid line.

SRAFs can be used to ensure that features will be printed correctly on the wafer even as the parameters of the printing process (focus, intensity, chemistry, wafer composition, etc.) vary through their anticipated range. (The combination of these variations of the parameters of the printing process are sometimes referred to as the process window.) SRAFs have been combined with optical proximity correction (OPC), off-axis illumination (OAI), attenuated phase shifted mask (APSM) enhanced lithography, embedded phase shifted mask (EPSM) lithography, and other techniques for even more accurate photolithography.

However, for non-collinear structures, i.e. structures that are not aligned along the same line, SRAFs cannot be used between the structures. This makes it more difficult to pattern non-collinear structures that are very close together. When structures on the wafer are to be printed very close together, the mask error enhancement factor (MEEF or mask error factor MEF) tends to increase which, in turn, leads to high variations in the critical dimension (CD) for the process across the printed area. The MEEF represents how much the size of a feature printed on a mask changes in response to a change in the mask. A MEEF of 1.0 indicates that a change in the mask causes a proportional change in the final printed wafer. In other words, moving a line 4 micrometers in the mask will move the same line 1 micrometer in the printed wafer, if the lithography optics reduces the mask image on the wafer by a factor of four. When features become small enough to be near the resolution limit of the photolithography system, the MEEF increases dramatically. This means that a small change on the mask produces a very large change on the printed wafer. This makes it difficult to precisely control feature sizes. The mask design is also made more complex because different features on the same mask will have different MEEFs.

The MEEF can be reduced by using a second mask and printing some features using one mask and other features using another mask. However, this doubles the time and expense of performing the exposure. The MEEF can also be reduced using hammerhead extensions and serifs. However, when the structures are placed closer together high MEEF and CD variability can occur.

BRIEF DESCRIPTION OF THE DRAWINGS

Embodiments of the present invention may be understood more fully from the detailed description given below and from the accompanying drawings of various embodiments of the invention. The drawings, however, should not be taken to be limiting, but are for explanation and understanding only.

DETAILED DESCRIPTION

For end-to-end non-collinear structures, sub-resolution assist features (SRAFs) may be used to bridge non-collinear structures together. The SRAFs improve corner rounding and allow the size of OPC end features, such as hammerheads and serifs to be reduced. In addition, corner pullback, reticle mask-making CD (critical dimension), and the mask error enhancement factor (MEEF) may be reduced without sacrificing the process window enhancement of the bridging SRAFs. In one embodiment, the SRAFS bridging two adjacent end-to-end structures are smaller than the SRAFs surrounding a feature. As a result, non-collinear structures may be patterned closer together. The connected features are easier to print with controlled CDs. As a further result, corner to corner minimum distances that constrain reticle printing, by e.g. electron beam, may be overcome.

Figure 1:
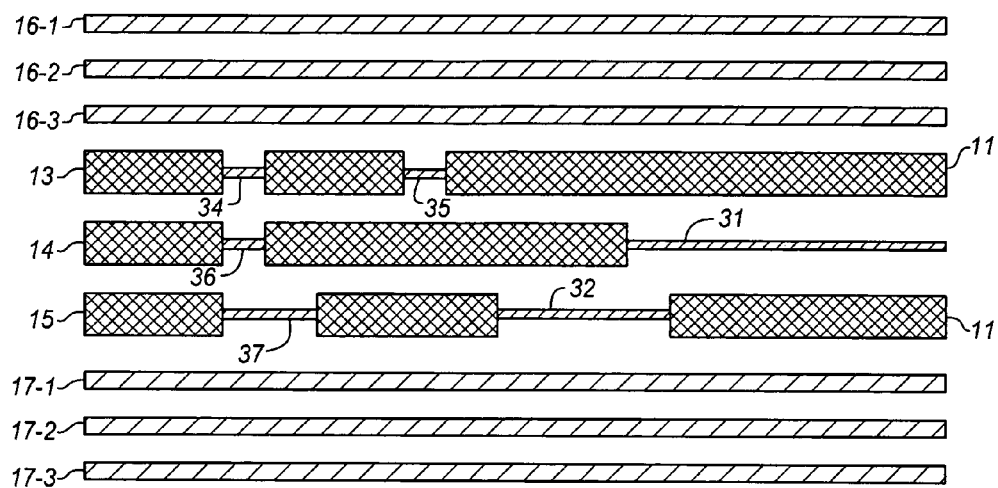
FIG. 1 is a diagram of a portion of a mask showing main features and SRAFs for collinear features.

FIG. 1 shows in a simplified diagram, a small portion of a photolithography mask with main features 11 and SRAF. The features of FIG. 1 are shown as examples of possible features and the shapes are simplified. Embodiments of the invention may be applied to many other types and shapes of features and to structures that are simpler and more complex than those shown. In FIG. 1, the main features are parallel line segments aligned into three adjacent horizontal rows 13, 14, 15.

SRAF is applied above and below the adjacent rows. So, for example above the top row 13, three parallel adjacent horizontal SRAF lines 16-1, 16-2, 16-3 are applied to the mask. Similarly three parallel, adjacent, horizontal SRAF lines 17-1, 17-2, 17-3 are applied below the bottom row of main features 15. The distance between all of the rows is based on a design rule for a keepaway distance between features. The keepaway distance is applied to the distances between main features, the distances between SRAF features and the distances between main features and SRAF features.

The mask is further enhanced by SRAF features applied to end-to-end regions between the main feature line segments. FIG. 1 shows six end-to-end gap regions between main features. SRAF features 31, 32, 34, 35, 36, 37 are applied to each of these end-to-end gap regions to bridge the gap between the ends of adjacent main features. The particular size and shape of the SRAF features may be adjusted for each gap and may or may not all be the same.

As can be seen in FIG. 1, conventional design rules limit how much SRAF may be used. If the keepaway distance is violated, then an increase in the mask error enhancement factor (MEEF) can be expected that will reduce the overall benefit that SRAF may offer. The distance is reflected in FIG. 1 in the vertical distance between the top row of main features and the first SRAF line as well as in the vertical distance between the bottom row of main features and the closest SRAF lines. The appropriate keepaway distance for any particular application will depend on the particular wafer, photolithography process and equipment. The smallest keepaway distance may be determined by preparing test wafers using the intended process and observing results through the process window.

The SRAFs are narrower than the main features but parallel to and aligned with the main features. In the example of FIG. 1, all of the main features are collinear and aligned in a grid. The main features may be considered to be linear in that they are mostly elongated (longer than they are wide) with substantially parallel sides. The SRAF features are collinear with the main features and aligned to the same grid. Each of the elongated main features may also be considered as having a centerline along its length. The SRAFs of FIG. 1 also have a centerline and the centerlines of the SRAFs are aligned with the centerlines of the main features on either end.

The size of the SRAFs in FIG. 1 may be determined conventionally based on the photolithography process and the size of the various main features. Typically, the SRAFs are sized so as to be below the resolution limit of the process, yet large enough to improve the resolution of the adjacent main features. SRAF sizing may be determined using a test wafer with SRAF features of varying widths and then observing the results. Typically, the largest feature that does not print though all process variations is the best size to use.

Figure 2:
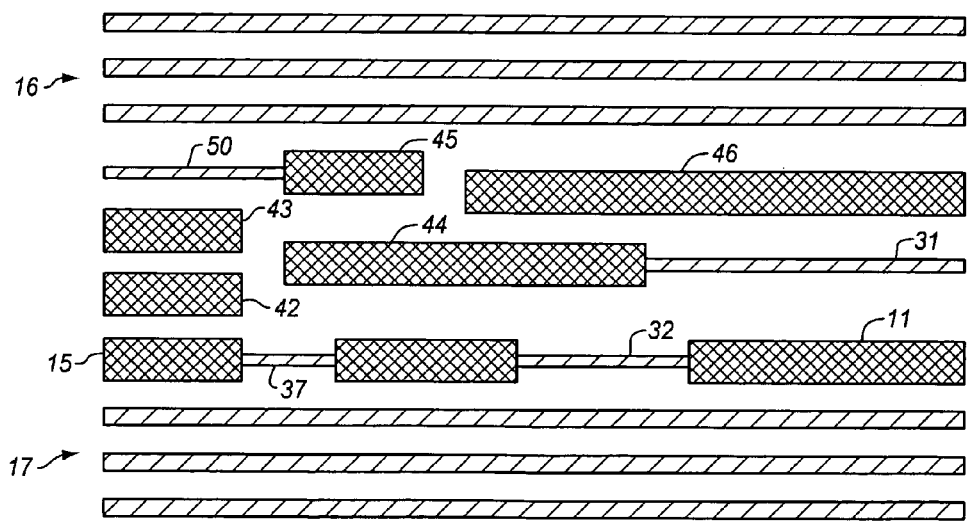
FIG. 2 is a diagram of a portion of a mask showing main features that are not all collinear and the application of SRAF between collinear features.

FIG. 2 shows a small portion of a photolithography mask that is similar to that of FIG. 1. As in FIG. 1, the central portion contains main features 11. Above and below the main features are rows of SRAFs 16, 17. The main features include a bottom row 15 of collinear main features with SRAFs 37, 32 in between the end-to-end regions of the main features, bridging the gaps between the main features. In addition, two of the main features indicated as 44 and 45 are sufficiently spaced away from any other features that SRAFs 31, 50 may be applied at one end to bridge the gap to another main feature not shown in FIG. 2 or to enhance the effectiveness of the parallel SRAF lines 16, 17. The remaining main features are not collinear and applying conventional rules, no SRAF may be used between these features.

Specifically, the left-side of the diagram shows the ends of two features 42, 43 which are parallel to the end of the left-most features in the bottom row. They are each spaced vertically apart by at least the keepaway distance. To the right of these two features and offset from the centerline of both are two more main features 44, 45. These two features are non-collinear with all three of the left-most main features. Another main feature 46 is also shown which is further to the right and not collinear with any of the other main features. FIG. 2 also shows how the upper rows of SRAFs are spaced farther apart from some of the main features in order to maintain the keepaway distance from all of the main features. Due to the offsets in the features of FIG. 2, SRAFs are more difficult to use and accordingly printing may be negatively affected as may be the MEEF.

Figure 3:
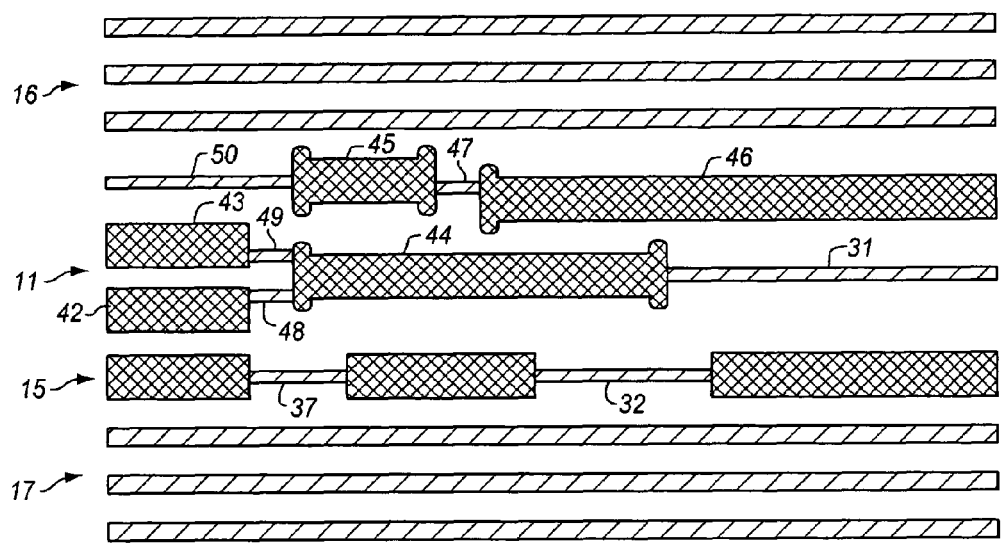
FIG. 3 is a diagram of the portion of the mask of FIG. 2 also showing SRAF between non-collinear features.

In FIG. 3, the same main features and SRAFs configuration as is shown in FIG. 2 is provided. However, additional SRAFs have been added also to enhance the printing of the offset main features. As in FIG. 2, the main features 11, are bounded at the top 16 and bottom 17 by rows of SRAFs. A bottom row 15 of collinear main features near the bottom group of SRAFs has SRAFs 37, 32 to bridge the end-to-end regions between the main features.

In contrast to the example of FIG. 2, in FIG. 3, even the gaps between offset main features may be bridged using SRAFs. As illustrated in FIG. 3, an end-to-end gap between two main features 45, 46 may be bridged by a narrow SRAF 47 that connects to the ends of each of the main features. The two main features and the SRAF are all parallel but not collinear. The SRAF 47 is approximately evenly offset from the two features. FIG. 3 also shows that OPC hammerheads are added to some of the main features 44, 45, 46 as compared to FIG. 2. Hammerheads, serifs and other OPC features may be added to any or all of the main features using conventional OPC techniques.

In another location of FIG. 3, two main features 42, 43 may be bridged to the same one main feature 44 due to the overlap between the end faces. One SRAF 48 may accordingly be added to bridge the gap between one main feature 42 on the left and a neighboring main feature 44 to its right. Another SRAF 49 may be applied to bridge the gap between another main feature on the left 43 and the same main feature on the right 44. As shown in FIG. 3, all of the main features and the SRAFs are parallel. However, the horizontal lines of FIG. 1 are not used for all of the features. The main features and the SRAFs accordingly are not all collinear. FIG. 3 shows that SRAFs may be applied as a collinear feature when the neighboring main features are collinear, and that SRAFs may be applied to main features that are not collinear whenever a parallel line may be drawn that connects with any two main features. The lines all remain parallel in FIG. 3 due to the scanning aspects of the photolithography equipment and in order to take advantage of diffraction effects of the illumination.

Figure 4A:
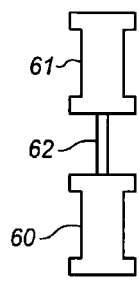
FIG. 4A is a diagram showing collinear features with SRAF bridging the end-to-end gap according to an embodiment of the present invention.

FIGS. 4A through 4E show the same idea as FIG. 3 in a simpler form and with different variations. In FIG. 4A, two main features 60, 61 are arranged parallel and collinearly along a vertical line. The two features are joined end-to-end by a sub-resolution assist feature 62 which is parallel with and collinear with the two main features. These two main features show a possible spatial relationship between two features as they may appear on a synthesized mask or a reticle. Any actual synthesized mask or reticle will contain hundreds, thousands or millions of such features. The features are shown with hammerheads as might be added during OPC or some other process. However, the features may not have hammerheads or may have other, additional, or different features depending on the particular implementation. The SRAF 62 may allow the two features to be printed larger or more accurately on a layer of photoresist on a wafer in photolithography.

Figure 4B:
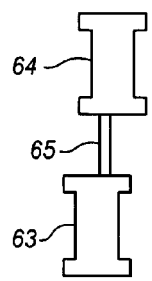
FIG. 4B is a diagram showing features offset by 25% with SRAF bridging the end-to-end gap according to an embodiment of the present invention.

In FIG. 4B, there are two features 63, 64 that are offset by 25%. While they are parallel as in FIG. 4A, they are no longer collinear. However, it is still possible to add an SRAF parallel to the two main features in the end-to-end regions between the two main features. As shown in FIG. 4B, the SRAF is elongated in the same direction as the main features and offset halfway between the centerlines of each of the two main features. In the example of the two isolated main features as shown in FIG. 4B, the best results may be obtained by balancing the SRAF between the two features. In other words, by offsetting the SRAF by half the offset between the two main features.

However, when there are other main features nearby or for nested features, better results may be obtained by displacing the SRAF in one direction or another. The optimum position for the SRAF may be determined by comparing sample wafers or through simulation. Similarly in FIG. 4B as well as in the other examples of FIGS. 4A through 4E the width and shape of the SRAF may be adjusted based on experimentation or simulation. In the Figures, the SRAF is shown as having parallel sides which are parallel to the sides of the main features. The width is 25% of the width of the main features and in these examples, the main features are the same size. However, different sizes and shapes may be used to suit particular applications.

Figure 4C:
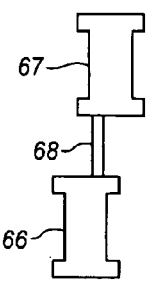
FIG. 4C is a diagram showing features offset by 50% with SRAF bridging the end-to-end gap according to an embodiment of the present invention.

In FIG. 4C, two main features 66, 67 are offset still further. The offset of FIG. 4C is 50%. In other words, the upper feature 67 is moved off the centerline of the lower feature 66 by 50% of the width of the features. While the offset is increased, an SRAF 68 may still be used to join the end-to-end gap between the two features.

Figure 4D:
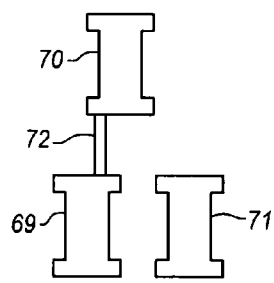
FIG. 4D is a diagram showing features offset by 75% with SRAF bridging one of two end-to-end gaps according to an embodiment of the present invention.

In FIG. 4D, two main features 69, 70 are offset by 75%. In addition, another main feature 71 is shown beside the bottom feature 69 and to the left. The two bottom features are shown side-by-side and horizontally aligned as may happen in many layout designs. Even with the 75% offset, the first two main features 69, 70, that is the left-side bottom feature and the top main feature, may be joined by an SRAF 72. As in the examples of FIGS. 4A-4C, the SRAF bridges the end-to-end gap between the main features. There is no SRAF bridging the end-to-end gap between the right side bottom feature 71 and the top main feature 70. In this example, the offset between these two features at 125% is too great.

Figure 4E:
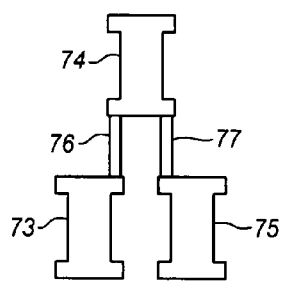
FIG. 4E is a diagram showing features offset by 100% with SRAF bridging two of two end-to-end gaps according to an embodiment of the present invention.

In FIG. 4E, the top main feature 74 is offset from the bottom main feature 73 by 100%. In other words, the sides of the features are approximately aligned and the bodies of each feature extend in different directions. The right-side bottom main feature is also offset from the top main feature by 100%. The spacing between the bottom main features is equal to the width of one main feature. In such a scenario, no parallel SRAF may be applied between the top and bottom features. Any parallel line between either bottom feature and the top feature would necessarily miss either the top or the bottom features since their sides do not overlap.

Depending on the design rules for the layout, it may be possible to move the two bottom features closer together so that such a parallel SRAF may be drawn. As another alternative, the SRAF may be added at an angle. However this may have other effects on the diffraction of illumination through the reticle. FIG. 4E shows another alternative. In FIG. 4E, two SRAFs are added. A left-side SRAF 76 connects the right-side hammerhead of the left-side bottom main feature 73 to the left-side hammerhead of the top main feature 74. Similarly a right-side SRAF 77 bridges the gap between the left-side hammerhead of the right-side bottom feature and the right-side hammerhead of the top feature 77. By connecting the hammerheads together with the SRAF, the features may still be connected by parallel SRAF even when the features have no overlap at all.

The sizes of the SRAFs may be carefully tuned based on the local proximity of neighboring features. The optimal SRAF position and sizing may be determined based on at least three criteria. First, the SRAF may be selected to be small enough that the image intensity created from the SRAF does not create a pattern in the photoresist during exposure. In one example, the threshold intensity for the SRAF needs to be less than or equal to about 70% of the target intensity of the main feature. The extra 30% margin ensures that no feature will be printed across process variations. Second, the SRAF may be selected to be large enough to improve the process window of an isolated feature so that it is close to that of the same size nested feature. In other words, SRAF is large enough to enhance the contrast of the aerial image of the main feature by some desired amount. Third, the addition of the SRAF should not significantly increase the mask error enhancement factor of the features or go beyond the resolution limits of the reticle manufacturing process. Additional criteria and design rules may be taken into consideration depending on the particular application.

In order to improve the use of SRAFs in end-to-end regions, a useful size range for SRAFs may be established based for example, on the criteria mentioned above. For such a range, the lower limit of SRAF size may be set to the minimum size producible on the mask that still increases the aerial image contrast of the main features. The maximum size may be set by the highest image intensity that will not produce an image on the photoresist reduced by some margin, for example the 30% margin mentioned above.

This minimum size may be used on all structures where the SRAF connects with the main features. The minimum size minimizes the MEEF of the end-to-end regions. The maximum size SRAF may be attached in regimes where the end-to-end distance is greater than, for example, about 5 times the width of the main features. The minimum size SRAF may also be attached directly to the main feature for a period of about the line width and then immediately increased to the maximum value of the SRAF range.

Adding a reduced size SRAF at the point at which SRAFs connect to the main feature provides a significant reduction of MEEF. If the SRAFs are not connected to the main features or if the SRAF is removed completely from the end-to-end region as shown in FIG. 1, the MEEF may rise quickly and the smaller end-to-end dimensions may not be patterned as well or at all. By adding some SRAF even a small size SRAF resolution is enhanced and MEEF is kept under control.

In the example of FIGS. 1, 2 and 3, an end-to-end region may be considered to be any two features that are closer than approximately 5 times their width. This particular parameter, as well as any other parameters mentioned above may be adapted to suit different applications, different processes and different dimensions. The examples of FIGS. 1 and 2 are also provided with SRAFs and features on a continuous grid. This allows end-to-end regions to be lined up horizontally to simplify consideration of different size regions. However, the same approach may be applied to layouts in any shape or form in which two features are positioned at close proximity.

As mentioned above, the best sizes for SRAFs may be determined empirically, by exposing test wafers with different sized features and different sized SRAFs and then examining the results. Additional test portions of the wafer may be used to evaluate the impact of the SRAFs on MEEF. Different tests may be performed for different processes. The most suitable dimensions may vary with different types of wafers, different types of photo-resists, different types of scanners, different types of masks, different sizes and shapes for main features, different chemistry, timing, temperatures, etc. In one example using EPSM with 193 nm illumination and main features widths of about 80 nm, SRAF features may be from about 20 nm wide to about 50 nm wide.

Another approach to determining appropriate sizes for SRAFs is to use process simulation software. This type of software typically produces a simulated aerial image for a particular simulated wafer pattern and then estimates the resulting pattern that would be printed on a semiconductor wafer. Such software allows different size SRAFs to be analyzed with different main feature configurations. The simulation software may be used together with empirical results in different ways to determine optimal SRAF sizes.

Figure 5A:
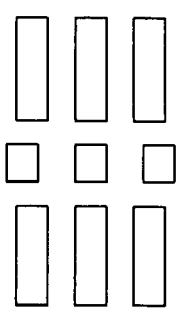
FIG. 5A is a diagram of a set of wafer features on a portion of an idealized mask.
Figure 5B:
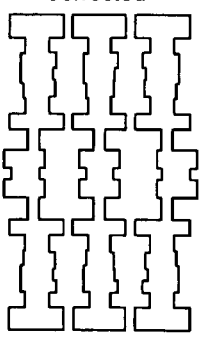
FIG. 5B is a diagram of the set of wafer features of FIG. 5A after applying SRAFs and OPC according to an embodiment of the present invention.
Figure 5C:
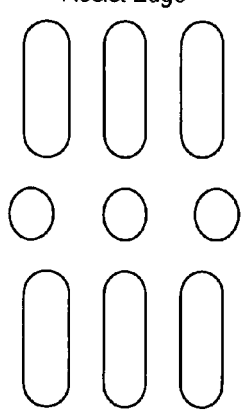
FIG. 5C is a diagram of a portion of a wafer as it would be printed based on the mask of FIG. 5B.

FIGS. 5A, 5B, and 5C provide an indication of results that may be obtained using SRAF for non-collinear features as shown in FIGS. 4A through 4E. FIG. 5A shows the main features as they are drawn on the theoretical desired wafer. These shapes represent idealized shapes that may be impossible or difficult to create on a wafer. FIG. 5B shows the same features as they may be produced on a mask. The same features are still present, however, SRAF with trim has been applied to bridge the end-to-end gaps between the features. In addition, the features have been modified using OPC. Instead of being simple rectangles, the widths of the features are varied in order to improve how they will print using, e.g. hammerheads, dog-ears and other OPC features.

FIG. 5C shows an example of a portion of a printed wafer that may be obtained with the mask of FIG. 5B. The drawing of FIG. 5C is based on a simulation that has been verified by measuring shapes produced on a real wafer. FIG. 5C shows that the rectangular shapes of FIG. 5A are reproduced very well. In addition, the relative sizes of the features and the distances between them are also very similar to that of FIG. 5A. Pullback in the end-to-end regions has been virtually eliminated and the sides of the features maintain the spacing of the grid.

Figure 6:
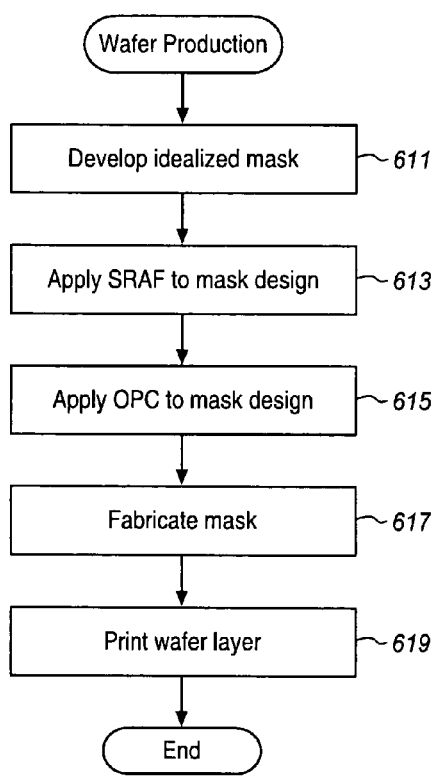
FIG. 6 shows an example of a wafer production process according to an embodiment of the present invention.

FIG. 6 shows an example of a wafer production process according to an embodiment of the invention. In FIG. 6, an idealized mask is developed at block 611. The idealized mask has all of the features that are desired to be printed on the wafer. Typically in such an idealized mask, the features have a shape that assumes that the printing accurately follow the shapes of the mask. However, the mask may already be optimized and adjusted according to any of a variety of different techniques.

SRAFs are applied to the idealized mask design at block 613. An example of such an application of SRAFs is described below in association with FIG. 7. In one example, SRAFs are applied in differing sizes depending on the shape, size and proximity of the main features.

OPC is applied to the mask design at block 615. OPC may be applied before or after the SRAFs are applied or both. In one embodiment, the mask design is developed using iterations of the aerial image until the printed result is optimized. The iterations may apply different types or amounts of SRAFs and OPC. In one embodiment, the application of SRAFs is incorporated into the OPC process. Alternatively, different or additional mask enhancement or improvement processing may be used. OPC may be replaced with other techniques, depending on the particular application.

At block 617 a real mask is fabricated based on the modified mask that results from the operations of block 615 and at block 619, a wafer is printed using photolithography and the fabricated mask. The wafer may be a semiconductor circuit, a micro-machine or any other microelectronic device.

Figure 7:
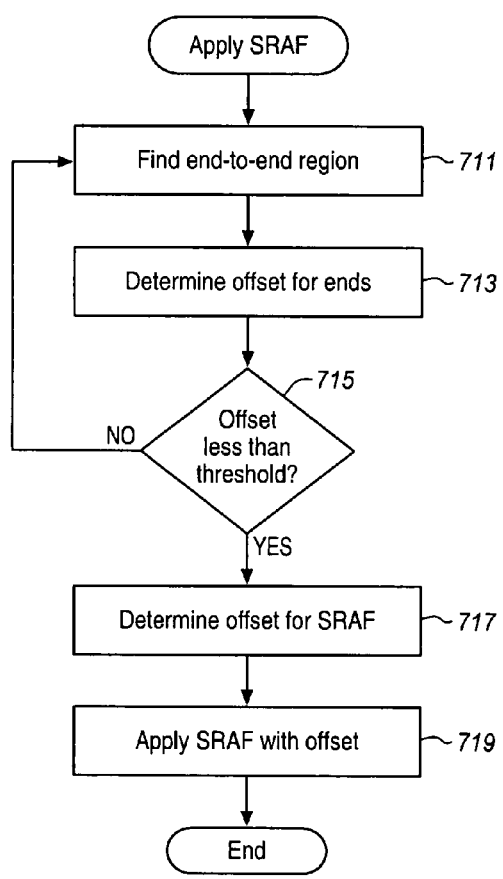
FIG. 7 shows an example of a process of applying SRAF to a mask design according to an embodiment of the present invention.

FIG. 7 shows an example of a process of applying an SRAF to a mask design according to an embodiment of the invention. Such a process may be applied to block 613 of FIG. 6. Initially an end-to-end region between ends of two main features in the idealized mask is found at block 711. Such end-to-end regions are shown, for example in FIGS. 1, 2, 3, and 4A through 4E. Selecting one such region, the offset between the two ends is determined at block 713. While this example is presented in the context of elongated features in a grid with ends that are positioned near each other. The same technique may be applied to features of other shapes and features that are not in a grid.

At block 715, the end-to-end offset is compared to a threshold. If the end-to-end offset is more than the threshold, then no SRAF is applied. A variety of different end-to-end offsets are shown from none in FIG. 4A to 100% in FIG. 4E. On the other hand, if the offset is an amount that is less than the threshold, then an offset is determined for an SRAF to be applied at block 717. The SRAF offset will determine how the SRAF will be positioned relative to the main feature ends. In the examples above, the SRAF is offset by an equal amount from the centerline of each main feature. However, different approaches may be used depending on the configuration of the features in the region. Finally, at block 719, the SRAF with the selected offset is applied. Additional operations may be added to FIG. 7 to select the size, shape and configuration of applied SRAF or to accommodate other factors.

In the examples above, different sizes of sub-resolution assist feature elements may be used. A wider size may be maximized to the largest size that can be placed on a mask without actually printing the feature on a wafer. A smaller size may be selected based on a compromise between size and MEEF. According to one principle of operation, the wider size is maximized and the rest of the end-to-end distance is filled in with the narrower size or trim ends. The length of the trim ends may be selected again based on a compromise between length and MEEF. However, many variations are possible from the simple two-size approach.

In one embodiment, there are three widths of SRAF elements. The third width is intermediate in size between the narrow size and the maximized size and is used to transition between the two sizes. In other words, the intermediate length is placed between the wider section and the narrower section. This may allow for more accurate printing on the wafer and it may allow the narrower trim end to be shortened. Additional intermediate lengths may be added to further increase this effect. Alternatively, each SRAF element may be optimized to its particular location. While a set of predefined widths may be used, the widths need not be restricted to specific sizes.

In another embodiment, for certain mask fabrication technologies, the trim ends may instead be shaped with angled sides. These sides are farthest apart, for the greatest width where the trim end meets the large-size element of the SRAF and closest together, for the least width, where the trim end meets the main printed feature. Such a tapered design achieves a result similar to that of the intermediate width features but with a single tapered feature. The angle of the sides for any particular lithography process may be determined using simulation and experiment.

In another embodiment, there may be more different sizes of SRAF elements so that the size of the SRAF and the size of the trim ends may be optimized for different end-to-end gap sizes. The different sizes may be developed based on simulation and experiment. In such an embodiment, the end-to-end distances may be divided into different ranges and the size and shape of the SRAF to be inserted may be determined based on which range matches with a particular distance on the mask. In order to adapt the SRAF to the different sizes within a range the length of the widest portion of the SRAF shape may be adjusted to fit.

Figure 8:
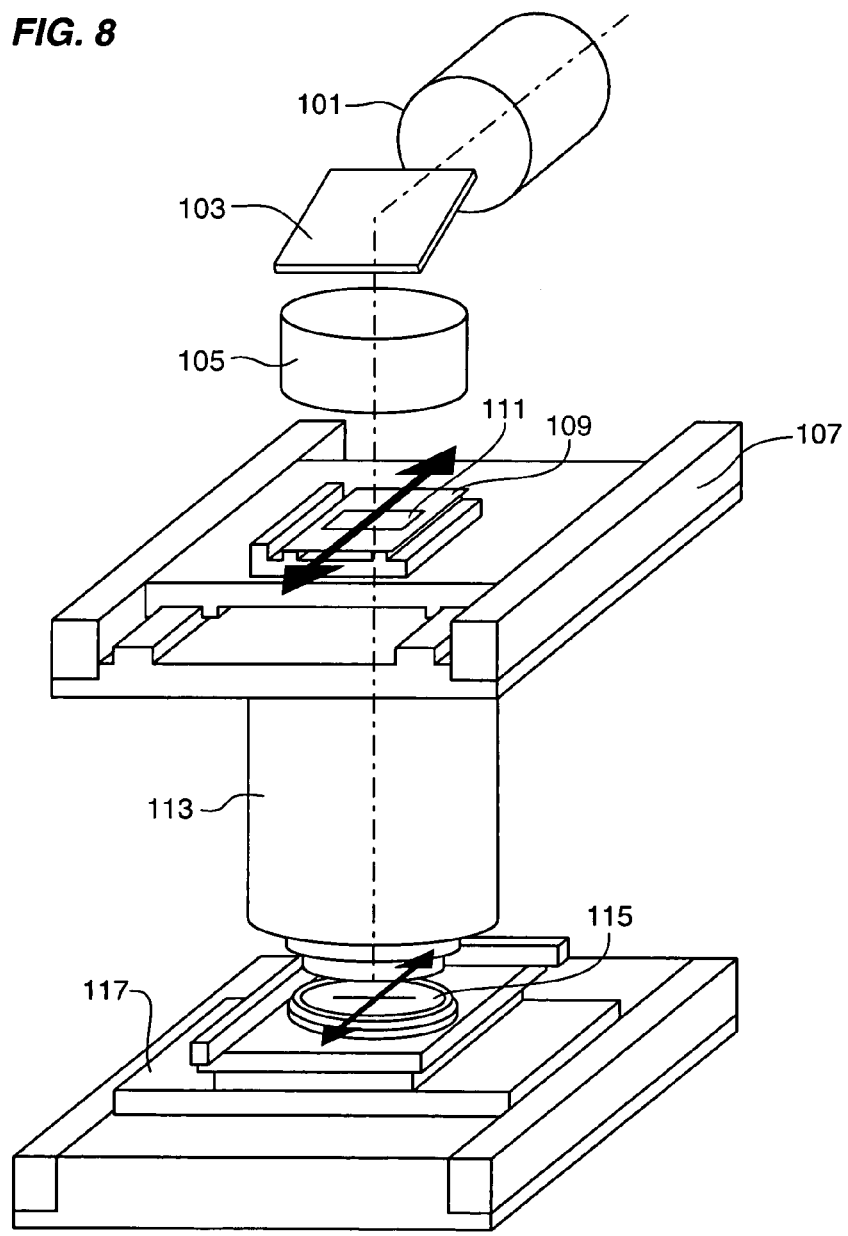
FIG. 8 is a diagram of a semiconductor fabrication device suitable for application to the present invention.

FIG. 8 shows a conventional semiconductor fabrication machine, in this case, a lens-scanning ArF Excimer Laser Stepper, that may be used to hold a mask or produce a wafer in accordance with embodiments of the present invention. The stepper may be enclosed in a sealed vacuum chamber (not shown) in which the pressure, temperature and environment may be precisely controlled. The stepper has an illumination system including a light source 101, such as an ArF excimer laser, a scanning mirror 103, and a lens system 105 to focus the laser light on the wafer. A reticle scanning stage 107 carries a reticle 109 which holds the mask 111. The light from the laser is transmitted onto the mask and the light transmitted through the mask is focused further by a projection lens with, for example, a four-fold reduction of the mask pattern onto the wafer 115.

The wafer is mounted to a wafer scanning stage 117. The reticle scanning stage and the wafer scanning stage are synchronized to move the reticle and the wafer together across the field of view of the laser. In one example, the reticle and wafer move across the laser light in a thin line, then the laser steps down and the reticle and wafer move across the laser in another thin line until the entire surface of the reticle and wafer have been exposed to the laser. Such a step and repeat scanning system allows a high intensity narrow beam light source to illuminate the entire surface of the wafer. The stepper is controlled by a station controller (not shown) which may control the starting, stopping and speed of the stepper as well as the temperature, pressure and chemical makeup of the ambient environment, among other factors. The stepper of FIG. 8 is an example of a fabrication device that may benefit from embodiments of the present invention. Embodiments of the invention may also be applied to many other photolithography systems.

The mask controls the size of each feature on the wafer. The mask design is made up of chrome metal lines, molybdenum silicide lines, or lines of some other material of different widths and shapes designed to create a particular pattern on the wafer. When OPC (Optical Proximity Correction) is applied to the mask, the mask is modified iteratively, primarily by modifying the widths of the metal lines and adding decorations to corners, until the photolithography model predicts that the final wafer will match the intended target design.

Figure 9:
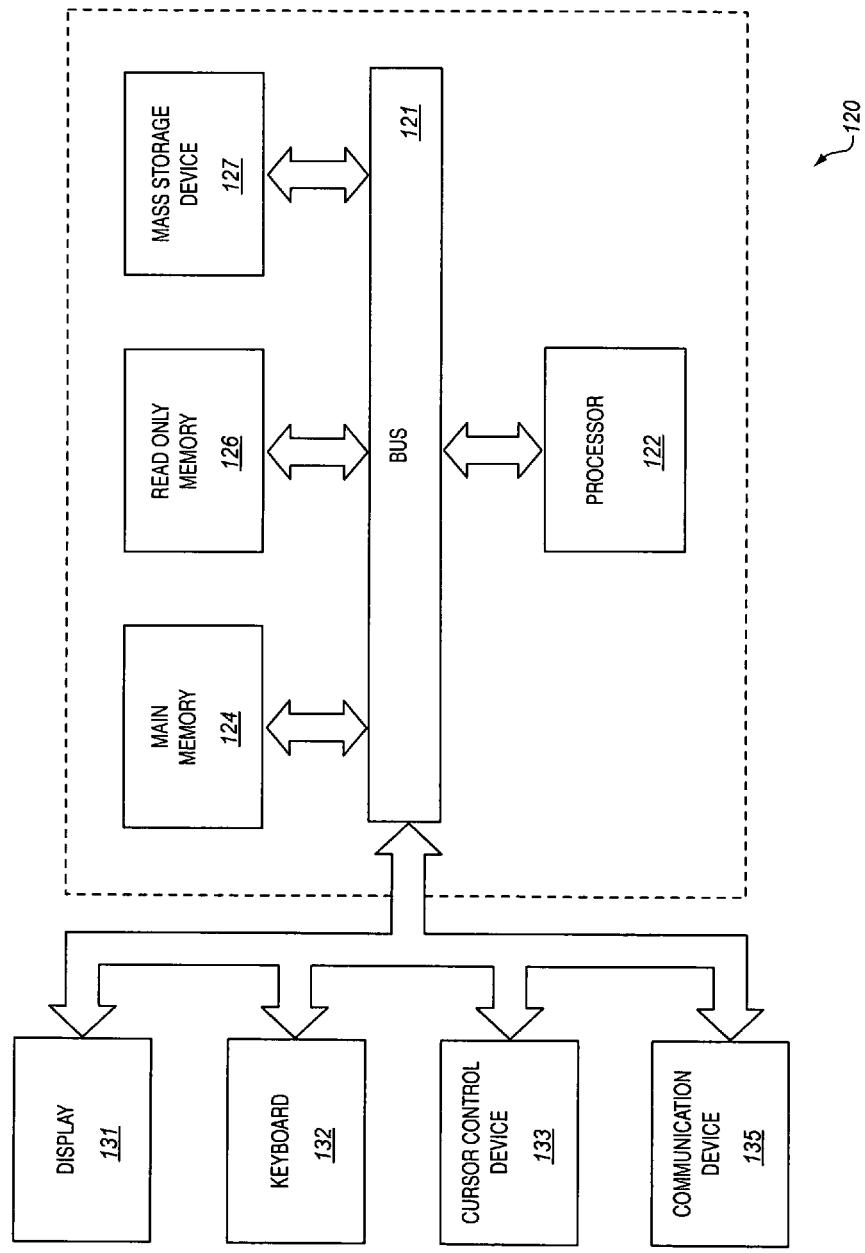
FIG. 9 is an example of a computer system capable of performing aspects of the present invention.

FIG. 9 shows a computer system 120 representing an example of a system upon which features of the present invention may be implemented. The computer system 120 includes a bus or other communication means 121 for communicating information, and a processing means such as a microprocessor 122 coupled with the bus 121 for processing information. The computer system 120 further includes a main memory 124, such as a random access memory (RAM) or other dynamic data storage device, coupled to the bus 121 for storing information and instructions to be executed by the processor 122. The main memory also may be used for storing temporary variables or other intermediate information during execution of instructions by the processor.

The computer system may also include a nonvolatile memory 126, such as a read only memory (ROM) or other static data storage device coupled to the bus for storing static information and instructions for the processor. A mass memory 127 such as a magnetic disk or optical disc and its corresponding drive may also be coupled to the bus of the computer system for storing information and instructions.

The computer system may also be coupled via the bus to a display device or monitor 131, such as a Liquid Crystal Display (LCD), for displaying information to a user. For example, graphical and textual indications of installation status, operations status and other information may be presented to the user on the display device. Typically, an alphanumeric input device 132, such as a keyboard with alphanumeric, function and other keys, may be coupled to the bus for communicating information and command selections to the processor. A cursor control input device 133, such as a mouse, a trackball, or cursor direction keys may be coupled to the bus for communicating direction information and command selections to the processor and to control cursor movement on the display 131.

A communication device 135 is also coupled to the bus 121. The communication device 135 may include a modem, a network interface card, or other well known interface devices, such as those used for coupling to Ethernet, token ring, or other types of physical attachment for purposes of providing a communication link to support a local or wide area network (LAN or WAN), for example. In this manner, the computer system may also be coupled to a number of clients or servers via a conventional network infrastructure, including an intranet or the Internet, for example.

It is to be appreciated that a lesser or more equipped computer system than the example described above may be preferred for certain implementations. Therefore, the configuration of the exemplary computer system 120 will vary from implementation to implementation depending upon numerous factors, such as price constraints, performance requirements, technological improvements, or other circumstances. Such a computer system may be used to perform simulations described above, and to generate or modify a mask as described above. In addition any of the microelectronic components of the computer system may be produced using a mask having SRAFs as described above.

Embodiments of the present invention may be provided as a computer program product which may include a machine-readable medium having stored thereon instructions which may be used to program a general purpose computer, mode distribution logic, memory controller or other electronic devices to perform a process. The machine-readable medium may include, but is not limited to, floppy diskettes, optical disks, CD-ROMs, and magneto-optical disks, ROMs, RAMs, EPROMs, EEPROMs, magnet or optical cards, flash memory, or other types of media or machine-readable medium suitable for storing electronic instructions. Moreover, embodiments of the present invention may also be downloaded as a computer program product, wherein the program may be transferred from a remote computer or controller to a requesting computer or controller by way of data signals embodied in a carrier wave or other propagation medium via a communication link (e.g., a modem or network connection).

It is to be appreciated that a lesser or more complex main feature set, mask layout, SRAF configuration, optimization process and photolithography process or system may be used than those shown and described herein. Therefore, the configurations may vary from implementation to implementation depending upon numerous factors, such as price constraints, performance requirements, technological improvements, or other circumstances. Embodiments of the invention may also be applied to other types of photolithography systems that use different materials and devices than those shown and described herein.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. A method comprising:
   synthesizing a photolithography mask having elongated features;
   finding an end-to-end gap between two elongated, parallel features, the ends of the two features facing the gap being overlapping, parallel, and linearly offset from one another;
   applying a sub-resolution assist feature to the end-to-end gap between the elongated features, the sub-resolution assist feature being parallel and linearly offset from the two features and connecting to the ends of the two features facing the gap; and
   modifying the synthesized photolithography mask to include the sub-resolution assist feature.

2. The method of Claim 1, further comprising determining an offset for the sub-resolution assist feature with respect to the ends of the two elongated features before applying the sub-resolution assist feature.

3. The method of claim 2, wherein determining an offset comprises selecting an offset that is equally divided between the two ends.

4. The method of claim 1, further comprising applying optical proximity correction to the synthesized mask.

5. The method of claim 1, wherein the mask has a grating pattern of alternating lines and spaces and wherein the sub-resolution assist feature is applied parallel to and offset from one of the lines.

6. The method of claim 4, wherein the two features are elongated along distinct non-collinear line segments and the sub-resolution assist feature is offset from both distinct line segments.

7. The method of claim 1, wherein applying a sub-resolution assist feature comprises comparing the size of the end-to-end gap to a threshold and if the end-to-end gap is greater than a threshold, then applying the sub-resolution feature having a first width and applying trim to either end of the sub-resolution assist feature between the sub-resolution assist feature and the feature ends, the trim having a second width, narrower than the first width.

8. An apparatus comprising a machine-readable medium having instructions which when executed by a machine cause the machine to perform operations comprising:
   synthesizing a photolithography mask having elongated features;
   finding an end-to-end gap between two elongated, parallel features, the ends of the two features facing the gap being overlapping, parallel, and linearly offset from one another;
   applying a sub-resolution assist feature to the end-to-end gap between the elongated features, the sub-resolution assist feature being parallel and linearly offset from the two features and connecting to the ends of the two features facing the gap; and
   modifying the synthesized photolithography mask to include the sub-resolution assist feature.

9. The apparatus of claim 8, further comprising determining an offset for the sub-resolution assist feature with respect to the ends of the two elongated features before applying the sub-resolution assist feature.

10. The apparatus of claim 8, wherein applying a sub-resolution assist feature comprises comparing the size of the end-to-end gap to a threshold and if the end-to-end gap is greater than a threshold, then applying the sub-resolution feature having a first width and applying trim to either end of the sub-resolution assist feature between the sub-resolution assist feature and the feature ends, the trim having a second width, narrower than the first width.

11. A mask comprising:
   a first elongated feature and a second elongated feature, the features being parallel, overlapping, and separated from each other by a gap, the ends of the two features facing the gap being linearly offset from one another;
   a sub-resolution assist feature between the first feature and the second feature, the sub-resolution assist feature being linearly offset from the first feature and linearly offset from the second feature, the sub-resolution assist feature being elongated parallel to the two features and connecting to the ends of the two features facing the gap.

12. The mask of claim 11, wherein the mask has a grating pattern of alternating lines and spaces and wherein the sub-resolution assist feature is applied parallel to and offset from one of the lines.

13. The mask of claim 11, wherein the two features are elongated along distinct non-collinear line segments and the sub-resolution assist feature is offset from both distinct line segments.

14. The mask of claim 11, further comprising optical proximity correction features on the first feature and the second feature.

15. The method of claim 1, wherein the elongated features comprise line segments, wherein the end-to-end gap is between the line segments, wherein the line segments are parallel but not collinear and, wherein the sub-resolution assist feature has a centerline that is parallel to and not collinear with the centerlines of the elongated features.

* * * * *

UNITED STATES PATENT AND TRADEMARK OFFICE
CERTIFICATE OF CORRECTION

PATENT NO. : 7,572,557 B2 Page 1 of 1
APPLICATION NO. : 11/297209
DATED : August 11, 2009
INVENTOR(S) : Wallace et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 841 days.

Signed and Sealed this

Seventh Day of September, 2010

David J. Kappos
*Director of the United States Patent and Trademark Office*